(12) United States Patent
Peter et al.

(10) Patent No.: US 8,895,438 B2
(45) Date of Patent: Nov. 25, 2014

(54) METHOD FOR FORMING A MULTI-LEVEL SURFACE ON A SUBSTRATE WITH AREAS OF DIFFERENT WETTABILITY AND A SEMICONDUCTOR DEVICE HAVING THE SAME

(75) Inventors: Maria Peter, Eindhoven (NL); Erwin Rinaldo Meinders, Veldhoven (NL)

(73) Assignee: Nederlandse Organisatie voor toegepast—natuurwetenschappelijk onderzoek TNO, Delft (NL)

( * ) Notice: Subject to any disclaimer, the term of this patent is extended or adjusted under 35 U.S.C. 154(b) by 236 days.

(21) Appl. No.: 13/129,260

(22) PCT Filed: Nov. 13, 2009

(86) PCT No.: PCT/NL2009/050685
§ 371 (c)(1),
(2), (4) Date: Jul. 26, 2011

(87) PCT Pub. No.: WO2010/056119
PCT Pub. Date: May 20, 2010

(65) Prior Publication Data
US 2011/0266563 A1 Nov. 3, 2011

(30) Foreign Application Priority Data

Nov. 13, 2008 (EP) .................................. 08169031

(51) Int. Cl.
*H01L 21/44* (2006.01)
(Continued)

(52) U.S. Cl.
CPC ......... *G03F 7/0002* (2013.01); *B29C 2059/023* (2013.01); *B29C 59/022* (2013.01); *B82Y 40/00* (2013.01); *B82Y 10/00* (2013.01); *B29C 2035/0827* (2013.01)

USPC ........................... 438/669; 438/197; 264/293

(58) Field of Classification Search
None
See application file for complete search history.

(56) References Cited

U.S. PATENT DOCUMENTS 7,998,651 B2    8/2011   Wuister et al.
8,067,265 B2 *  11/2011  Zheng et al. .................... 438/99
(Continued)

FOREIGN PATENT DOCUMENTS

JP    200564409      10/2005
JP    2006521682     9/2006
(Continued)

OTHER PUBLICATIONS

Bharat Bhushan et al: "Wetting, adhesion and friction of superhydrophobic and hydrophilic leaves and fabricated micro/nanopatterned surfaces" Journal of Physics: Condensed Matter, J200880604 Institute of Physics Publishing, Bristol, GB vol. 20, Apr. 30, 2008, Nr22, pp. 225010, XP020135838 ISSN 0953-8984.

(Continued)

*Primary Examiner* — W. Wendy Kuo
*Assistant Examiner* — Shaka White
(74) *Attorney, Agent, or Firm* — Waddey & Patterson, P.C.; James R. Cartiglia

(57) ABSTRACT

The invention relates to a method 10 for forming a multi-level surface on a substrate 2, wherein said surface comprises areas of different wettability, the method comprising the step (A, B) of applying a multi-level stamp to the substrate for forming the multi-level surface, said multi-level stamp having different structural regions 1a arranged along the multi-level surface for locally altering wettability properties of at least a portion of a level of the multi-level surface 2a, 2b. The invention further relates to a semiconductor device and a method for manufacturing a semiconductor device.

20 Claims, 9 Drawing Sheets

(51) Int. Cl.
 *B82Y 40/00* (2011.01)
 *B82Y 10/00* (2011.01)
 *G03F 7/00* (2006.01)
 *B29C 59/02* (2006.01)
 *B29C 35/08* (2006.01)

(56) References Cited

U.S. PATENT DOCUMENTS

2004/0192041 A1   9/2004   Jeong et al.
2005/0003146 A1*  1/2005   Spath .......................... 428/105
2005/0026346 A1*  2/2005   Blankenstein et al. ....... 438/200
2006/0290021 A1   12/2006  Li et al.

FOREIGN PATENT DOCUMENTS

JP        2007216493         8/2007
JP        2007307899         11/2007
WO        2004055920         7/2004
WO        2004086471         10/2004
WO        WO 2007128965 A1 * 11/2007

OTHER PUBLICATIONS

PCT/NL2009/050685 International Search Report, mailed Jan. 25, 2010.

* cited by examiner

METHOD FOR FORMING A MULTI-LEVEL SURFACE ON A SUBSTRATE WITH AREAS OF DIFFERENT WETTABILITY AND A SEMICONDUCTOR DEVICE HAVING THE SAME

FIELD

The invention relates to a method for forming a multi-level surface on a substrate with areas of different wettability. In particular, the invention relates to a method for forming a multi-level surface on a flexible plastic (polymer) substrate, wherein material properties of at least a portion of a level are modified. More in particular, the invention relates to a semiconductor device and a method of manufacturing thereof.

BACKGROUND OF THE INVENTION

An embodiment of a method for forming a surface having modified wettability is known from WO 2008/051166. In the known method a substrate, for example, a polymer substrate is subjected to an action of an imprint mold with structured two-dimensional surface, which is arranged to modify wetting properties of the substrate material substantially along the whole surface. In this way, in particular, a microfluidic device may be manufactured, wherein a liquid flow along a suitable surface is enabled.

In a further embodiment of the known method, use is made of two molds which are sequentially applied to the substrate for selectively further modifying the wetting properties of the previously formed two-dimensional surface of the substrate. However, in order to achieve this, the second mold has to be suitably oriented and suitably aligned with respect to the structures created in the first imprint step.

SUMMARY OF THE INVENTION

It is a disadvantage of the known method, in particular with respect to modifying wetting properties of flexible substrates, that two imprinting steps are required, wherein, for producing different wettability regions, a suitable mutual orientation and alignment of the molds between the first and the second imprint steps have to be preserved with a high degree of accuracy. Flexible plastic substrates are dimensionally unstable, therefore, the two step imprinting method known in the art, might cause severe misalignment of the structures to be provided in the substrate.

It is an object of the invention to provide a method for forming a multi-level surface on a substrate with areas of different wettability, which is simple and reliable.

It is a further object of the invention to provide a method for forming a multi-level surface on a substrate with areas of different wettability, suitable for application on flexible substrates.

It is a still further object of the invention to provide a method of forming a multi-level surface having areas of different wettability on a substrate, which can be implemented in one step thereby defining a device layout and preventing distortion/deformation of a substrate and misalignment between the different functional layers in a device.

It is a still further object of the invention to provide a method for manufacturing a semiconductor device wherein deposition of materials constituting different levels of the semiconductor device is enabled with increased accuracy.

It is a still further object of the invention to provide a semiconductor device wherein alignment between materials constituting different levels/functional layers in architecture of the semiconductor device is achieved with an increased accuracy.

To this end the method according to the invention comprises the step of:

applying a multi-level stamp to the substrate for forming the multi-level surface, said multi-level stamp having different structural regions arranged along the multi-level surface for locally altering wettability properties of at least a portion of a level of the multi-level surface.

The invention is based on the insight that by structuring a substrate by a single mold, which surface properties have been suitably adapted, for example by micro- or nano-machining, corresponding surface properties of the resulting multi-level surface can be easily tuned. Other techniques, including, but not limited to optical lithography, focused ion beam etching, e-beam or laser beam lithography of the multi-level stamp may also be used for the multi-level stamp manufacturing for yielding the structural regions.

The method according to the invention has an additional advantage in that suitable levels of a device architecture can be defined in one processing step, thus preventing deformation of the substrate and assuring high precision alignment between the layers. As a result, deposition of materials needed in the device, functional, or active layers, can also be deposited selectively making use of the areas with different wetting properties.

The multi-level stamp may be applied to the substrate by either of: imprinting, embossing, or imprinting or embossing followed by radiation curing. It will be appreciated that the multi-level stamp may comprise two or more levels, wherein at least one level is arranged with a structural region being patterned or machined for adapting wetting properties of the resulting multi-level substrate surface. It will further be appreciated that the term "altering wettability" refers to an action of modifying wetting property of an area towards more hydrophilic or more hydrophobic with respect to an original value of the wetting property of a surface of the substrate.

It will be appreciated that the term "multi-level" refers to a two or three dimensional surface structure having at least two height levels, which may also be referred to as height steps and within the levels at least one is patterned with smaller structures providing areas with different wetting.

In accordance to the invention, a substrate, preferably a flexible substrate, is provided with at least one region having adapted wettability properties. This is advantageous as material deposition on the thus formed levels may be controlled by suitably adapting the wetting properties of the substrate, for example, by modifying them in a hydrophilic or in a hydrophobic direction.

It will be appreciated that different substrates may be used for practicing the method. For example, a resist, a gel or rigid substrate with a foil, resist or gel on top of it may be selected for practicing the invention.

It is found that particularly for a flexible polymer/plastic foil, a resist, or a gel, the method according to the invention ensures improved material deposition. However, it will be appreciated that the method according to the invention is not limited to be practicable on the named substrates, as rigid substrates provided with a flexible top layer are contemplated as well.

In an embodiment of the method according to the invention, the multi-level stamp comprises different structural regions expanding substantially along each level.

It is found to be advantageous to provide a method for forming a multi-level surface on a substrate with areas of different wettability, wherein such areas extend substantially over different height levels. For example, in a two-leveled structure, a lower level may be set to be hydrophobic and an upper level may be set to be hydrophilic. In this way material deposition on the lower level and on the upper level of the multi-level surface may be confined to respective areas having compatible wetting properties.

In a further embodiment of the method according to the invention, the multi-level stamp comprises different structural regions, each partially expanding along at least one mutual level.

For some situations, for example, during forming a transistor structure, it may be advantageous to provide one level with different areas having different wettability. In this way different materials may be accurately deposited on respectively compatible areas of the same level.

In a still further embodiment of the method according to the invention, the multi-level surface comprises a first region having a first wettability and a second region having a second wettability, the method further comprising the steps of:
  applying a first material in the first region;
  applying a second material in the second region.

It is found that by selectively adapting the wettability properties of a region or regions of a three-dimensional surface of the substrate, suitable materials, for example, layers of a transistor, may be accurately deposited on the substrate. As a result, operational properties of the transistor may be improved due to accurate alignment between the active layers. For example, the first material and/or the second material may be selected from a group consisting of: a conductive material (e.g. metal containing), a semiconductor, a dielectric.

A semiconductor device according to the invention comprises a multi-level surface of a material interface, wherein said surface comprises areas of different wettability. In particular, in a semiconductor device according to an aspect of the invention, at least a portion of a level of said multi-level surface has locally altered wettability properties.

These and other aspects of the invention will be further discussed with reference to drawings, wherein like reference signs represent like elements. It will be appreciated that the drawings are presented for illustrative purposes only and may not be used to limit the scope of the appended claims.

DETAILED DESCRIPTION OF THE DRAWINGS

Figure 1:
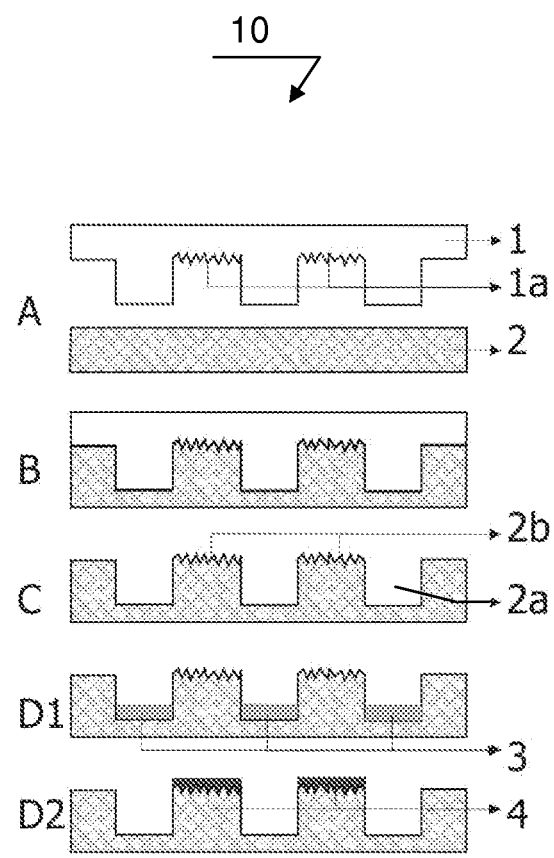
FIG. 1 presents in a schematic way an embodiment of a method according to the invention wherein a multi-level surface comprising two levels is formed where the upper level has different wetting property due to nano- or micro-structuring.

FIG. 1 presents in a schematic way an embodiment of a method according to the invention wherein a multi-level surface comprising two levels is formed. According to the present embodiment, the method 10 may comprise steps A, B wherein a substrate 2, for example a rigid substrate with a polymer or resist layer on top or a flexible substrate, is processed by means of a multi-level stamp (mold) 1, which comprises structural regions 1a conceived to modify wetting properties of corresponding areas 2b of a two-dimensional surface formed on the substrate 2 (see step C), whereas areas 2a may be not affected. It will be appreciated that the regions 2b may be hydrophobic or hydrophilic in an absolute sense, or they may be hydrophobic or hydrophilic in a relative sense, for example with respect to an original state of the surface.

It will be appreciated that although steps A, B are referred to as separate entities, in fact, the multi-level surface having pre-determined areas of modified wettability properties is formed pursuant to a single act of mechanical interaction between the multi-level mold 1 and the substrate 2. Due to the fact that a multi-level mold is used, no additional procedures for forming structures at different height levels of the substrate are required. The resulting multi-level surface, thus, corresponds to the lay-out of a suitable device conceived to be produced. Suitable examples of such device may relate to a semiconductor device, like a transistor or a pixel, a microfluidic device or the like.

The regions 1a may be provided by micro- or nano-machining of the mold by mechanical means or by a laser beam, by optical or e-beam lithography, for example for patterning suitable grooves or other irregularities. It will be appreciated that any suitable means of achieving desirable surface roughness are contemplated.

At step D1 a first material 3 may be deposited on the surface of the substrate 2, wherein the first material would adhere only to regions whose wettability is not modified. Material 3 may be deposited using any suitable technique, for example it may be spin coated, printed or deposited using dipping.

At step D2 a second material 4 is deposited on the surface of the substrate, wherein the second material adheres only to areas 2b whose wettability has been modified accordingly.

It will be appreciated that the multi-level stamp 1 may be transparent with respect to a suitable wavelength used during processing, for example with respect to ultra-violet (UV). The substrate 2 may relate to a rigid substrate with a polymer or resist layer or flexible plastic substrate, a resist layer, which may be UV or thermally curable, or it may relate to a liquid-like material, like a polymer, a sol-gel system that may be hardened after imprinting. The stamp 2 may be pushed into the substrate mechanically, for example while heating, or gently if a UV curable substrate is used. When the stamp is transparent, suitable radiation may reach the substrate through the stamp.

It will be appreciated that the area 2a, 2b may be inverted, that is, an area with a modified wettability may be arranged in the grooves, while an area with an original surface wetting may be left at respective tops. It will also be appreciated that the pattern of grooves and tops may be regular or irregular and that walls forming grooves may be substantially vertical or inclined.

Figure 2:
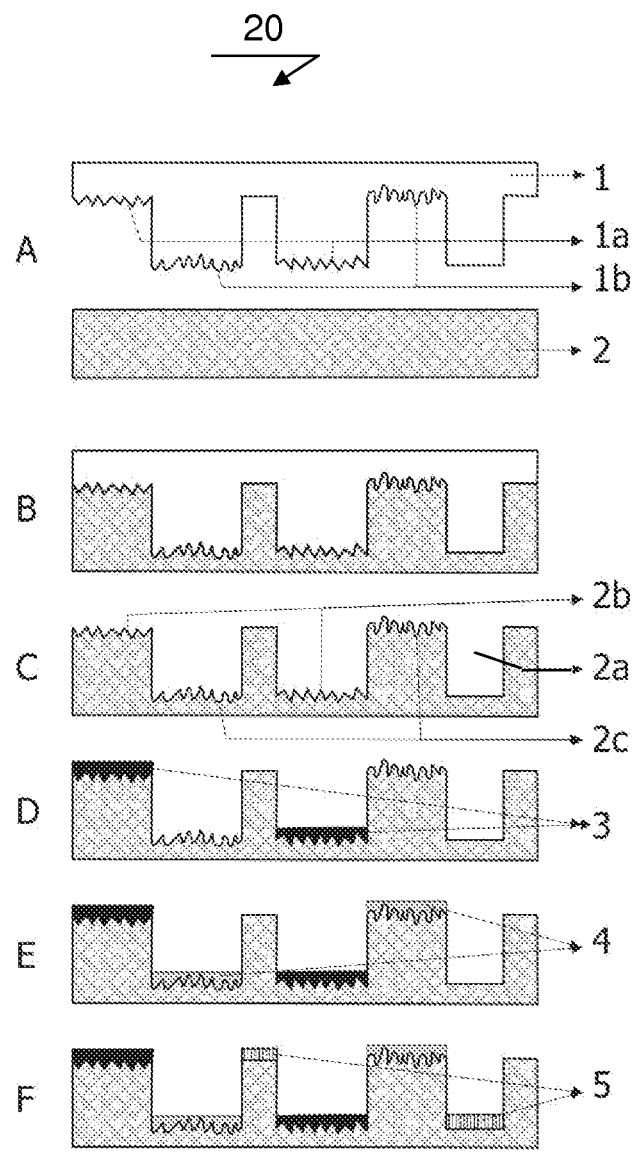
FIG. 2 presents in a schematic way an embodiment of a method according to the invention wherein a multi-level surface comprising two levels is formed presenting different structural regions within the same level.

FIG. 2 presents in a schematic way an embodiment of a method according to the invention wherein a multi-level surface comprising two levels is formed. In the present embodiment of the method 20 according to the invention, the stamp 1 may comprise first structural regions 1a and second structural regions 1b, said first and second structural regions having different surface roughness.

As a result of a processing of a substrate 2 with the stamp 1, a surface with two-level structures is formed on the substrate 2 comprises at least areas 2b and 2c with modified wetting properties. It will be appreciated that next to areas 2b and 2c the substrate 2 may comprise an area 2a having an original wettability.

Similarly, at steps D, E and F a first, a second and a third material may be deposited on the substrate 2, wherein each material would adhere to a portion of the multi-level surface, which has compatible wetting surfaces. For example, the first material 3 would adhere only to regions 2b, the second material 4 would adhere only to regions 2c and the third material 5 would adhere only to region 2a.

Figure 3:
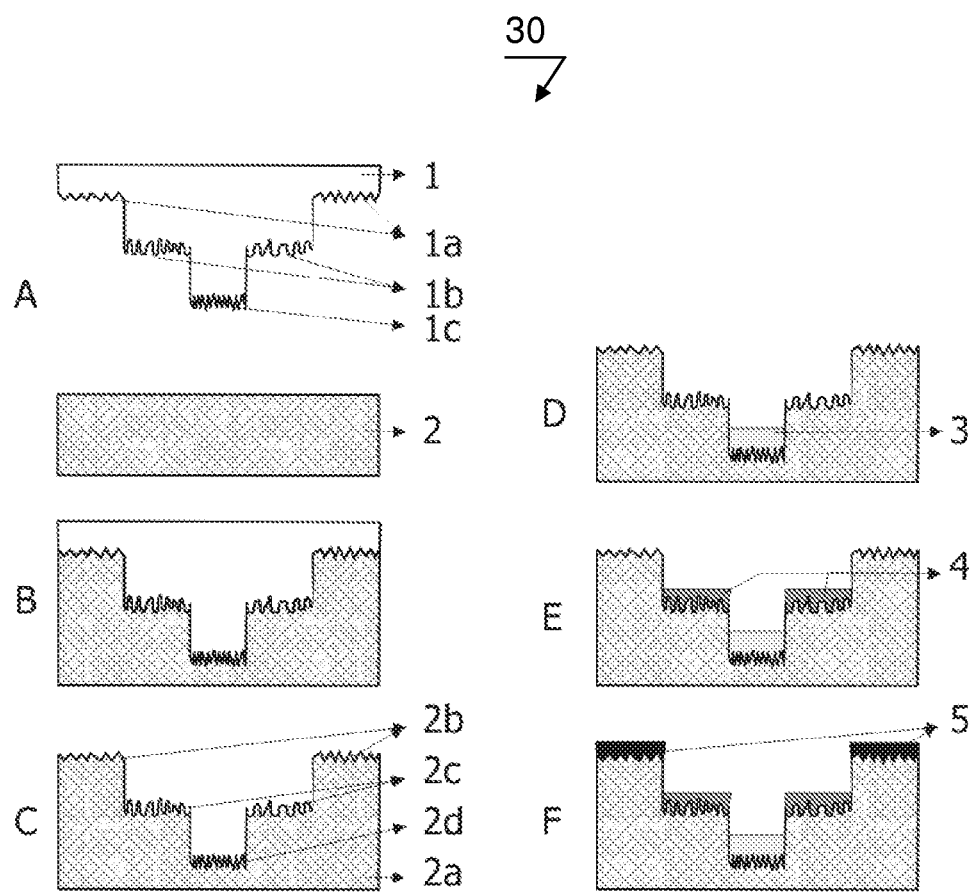
FIG. 3 presents in a schematic way a further embodiment of a method according to the invention wherein a multi-level surface comprising three levels is formed each level with different structural patterns, suitable for a bottom gate top contact transistor.

FIG. 3 presents in a schematic way a further embodiment of a method according to the invention wherein a multi-level surface comprising three levels is formed. In a further exemplary embodiment of the method 30 according to the invention the stamp 1 comprises three-levels, each having structural regions of the same type 1a, 1b, 1c.

When a substrate 2 is processed (see steps A, B and C) with such stamp a surface with three dimensional structures is provided which has at least three levels, wherein each level having its own wettability 2b, 2c, 2d. At steps D, E, F suitable materials 3, 4, 5 may be deposited on the three-dimensional surface structures formed in the substrate substantially solely are regions having compatible wetting surface with respect to such materials. As a result material, deposition substantially only at pre-selected area is enabled, improving operational properties of a final product, for example of a semiconductor device or of an electronic unit, like a display, operable using the semiconductor device.

Figure 4:
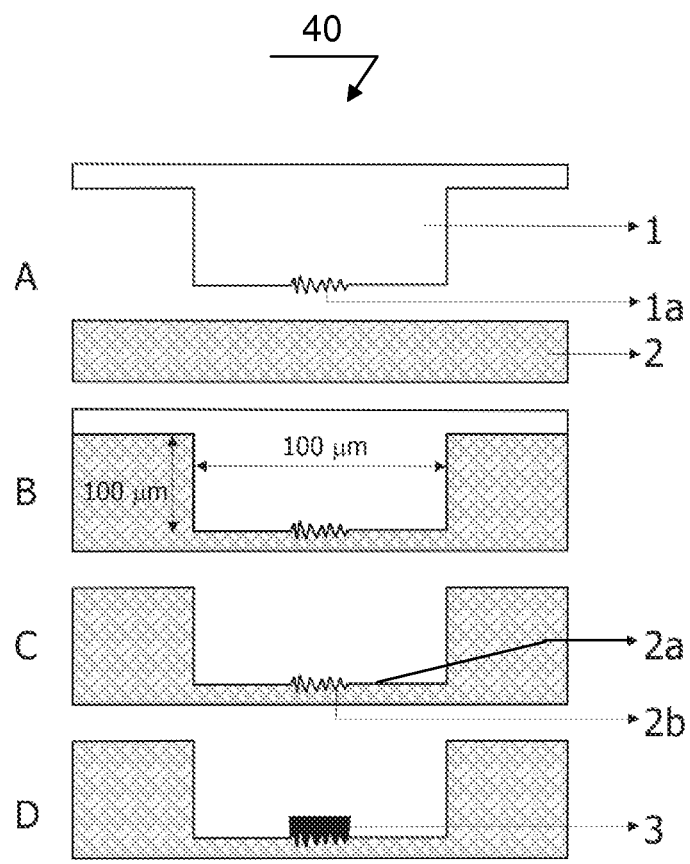
FIG. 4 presents in a schematic way an embodiment of a method according to the invention wherein a multi-level surface comprising two levels is formed, wherein wetting properties of one level are partially modified.

FIG. 4 presents in a schematic way an embodiment of a method according to the invention wherein a multi-level surface comprising two levels is formed, wherein wetting properties of one level are partially modified. In accordance with the present embodiment of the method 40 according to the invention, for example, a micro fluidic device may be provided.

At steps A-C, a mold 1 may be provided having one or more protruded regions 1, only a portion 1a of surface thereof being partially structured. For example, the portion 1a, may be roughened to cause a corresponding multi-level surface of the substrate 2 to have an area 2b exhibiting modified wettability. It will be appreciated that a width/lateral dimension of corresponding groove or grooves may be suitably selected. However, for fluidic devices, such dimension is preferably set to about 100 micrometers. Depth of the grooves may be set to a value between 10 and 100 micrometers.

The grooves having depth of about 10 μm may be used for manufacturing of display pixels, whereas grooves having depth of about 100 μm may be used for manufacturing microfluidic devices. It will be appreciated that the method according to the invention is suitable for forming multi-level structures in rigid or flexible substrates, wherein absolute dimensions of the structures are not limited by the named examples and may be in a range of at least 1-1000 μm.

At step D a material 3 may be deposited only in the area 2b, for example a metal, a metal containing material or any other conductive or active material compatible with the wetting properties of area 2b. Area 2b may be hydrophilic and areas 2a hydrophobic, or vice versa.

Figure 5:
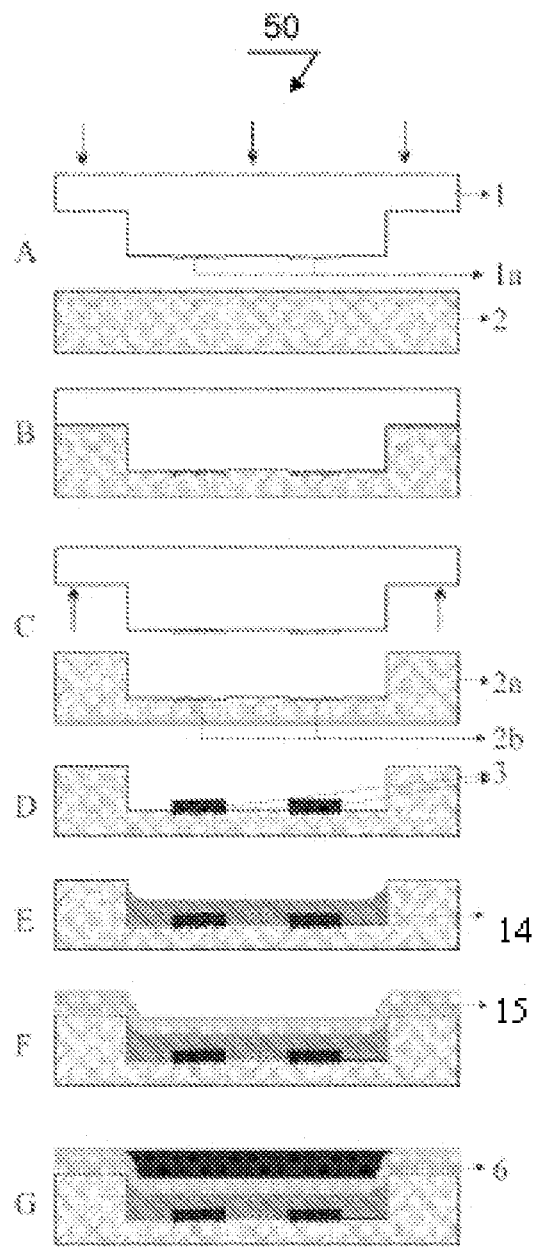
FIG. 5 presents in a schematic way an embodiment of a method according to the invention for forming a semiconductor device: top gate bottom contact transistor.

FIG. 5 presents in a schematic way an embodiment of a method 50 according to the invention for forming a semiconductor device. In this particular embodiment forming a top-gate, bottom contact transistor is enabled.

At steps A-C a multi-level stamp 1 having structural regions 1a is applied to a substrate 2 resulting in modifying wetting properties of a thus formed multi-level surface of the substrate 2a at areas 2b.

At step D an electrode material 3, for example metal or any other conductive material, may be deposited at areas 2b. At step D a semiconductor 14 may be deposited on top of a structure formed at step C. At step F a dielectric 15 may be deposited on top of the semiconductor. Finally, at step E a gate material 6 is deposited.

In accordance with the invention, due to the fact that at least the electrode material 3 is accurately deposited due to a match thereof with wetting properties of the three-dimensional surface at pre-determined areas 2b.

Figure 6:
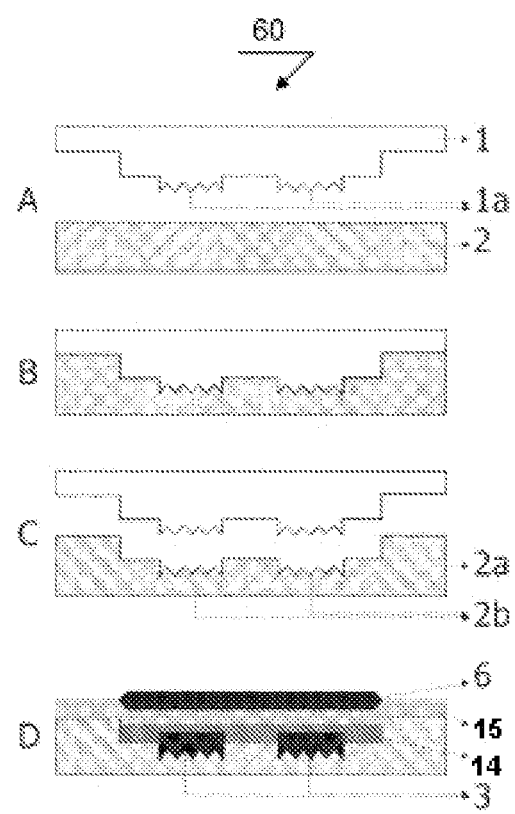
FIG. 6 presents in a schematic way a further embodiment of a method according to the invention for forming a semiconductor device: also top gate bottom contact transistor with partially embedded source-drain electrodes.

FIG. 6 presents in a schematic way a further embodiment of a method 60 according to the invention for forming a semiconductor device. In this particular embodiment, forming of a top-gate bottom contact transistor by means of a three-level stamp is enabled.

Accordingly, at steps A-C, a substrate 2 is processed by means of a three-leveled stamp 1, wherein outer projections of the stamp are suitably machined for forming structural regions 1a. It will be appreciated that the structural regions 1a may be arranged to alter the surface 2b of the substrate in a same or in different way with regard to wettability.

At step D, first an electrode material 3 is deposited at areas 2b, resulting in partially embedded electrodes, where after a semiconductor material 14, a dielectric material 15 and a gate material 6 are deposited.

Figure 7:
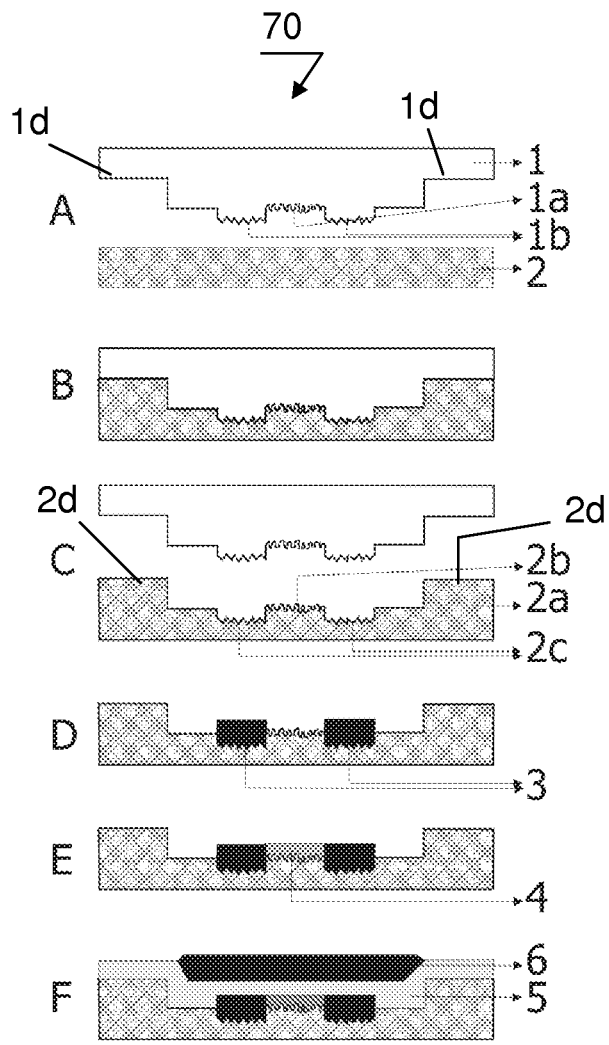
FIG. 7 presents in a schematic way a still further embodiment of a method according to the invention for forming a semiconductor device: top gate bottom contact transistor with embedded gate electrodes and patterned semiconductor.

FIG. 7 presents in a schematic way a still further embodiment of a method 70 according to the invention for forming a semiconductor device. A multi-level stamp 1 comprises three levels, some of which may be suitably pre-machined (pre-patterned) for providing structural regions 1a, 1b. After steps A-C are completed a substrate 2a having a multi-level surface is provided, wherein the multi-level surface comprises areas of modified wettability 2b, 2c. At step D a first material 3, for example a gate electrode, is deposited. By suitably selecting wetting properties of the areas 2b and 2c, it can be achieved that the material 3 will only adhere to the substrate at pre-defined areas 2c. At step E a semiconductor material is deposited substantially only at area 2b. At step F forming of a transistor structure may be completed by depositing a dielectric material 5 and a gate material 6.

It will be appreciated that, optionally, wetting properties of areas 2d may also be altered by using a template 1, comprising suitably structured regions 1d. This feature may assist during a step of depositing the gate material 6 by providing a material boundary beyond which the material 6 will not expand. Such material boundary may be obtained by allowing the areas 2d to have incompatible wetting properties with respect to the gate material 6, for example by arranging the areas 2d as (super)hydrophobic areas.

It will be further appreciated that regions 2d may also be used for allowing fabrication of isolated structures, for example, isolated transistor arrays on a substrate. In this case dielectric 5 may also be patterned.

It will be further appreciated that although exemplary embodiments discussed with reference to FIGS. 5-7 relate to a top gate, bottom contact transistor, the multi-level stamp 1 and corresponding method steps may suitable by adapted for enabling manufacturing of a bottom gate, top contact transistor or a bottom gate, bottom contact transistor.

Figure 8:
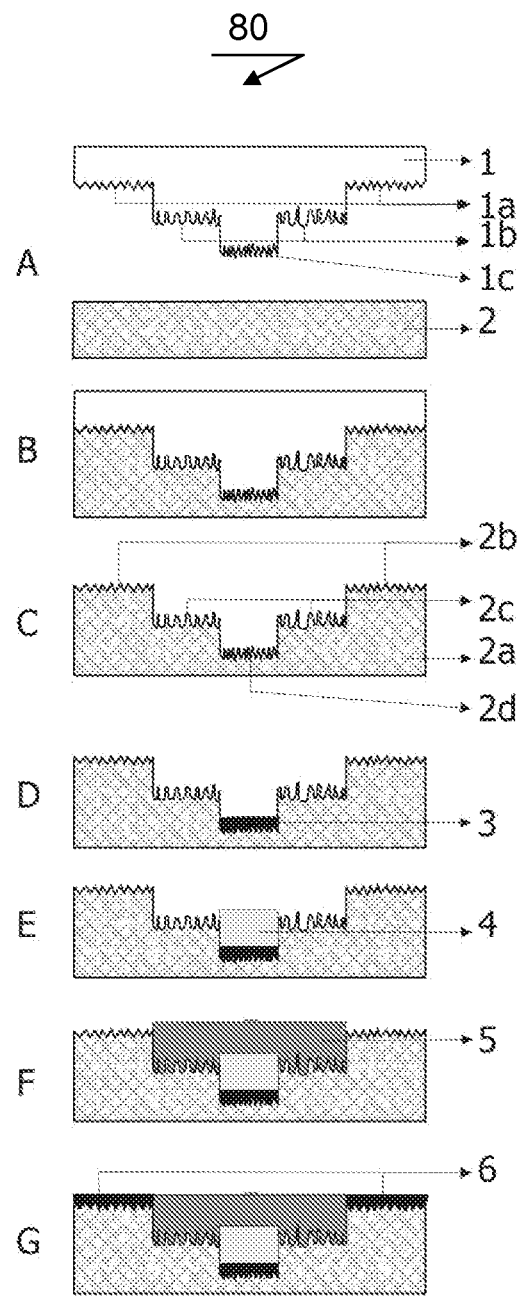
FIG. 8 presents schematically a still further embodiment of the method according to the invention: a bottom gate top contact transistor with embedded gate and patterned semiconductor and dielectric layers.

FIG. 8 presents schematically a still further embodiment 80 of the method according to the invention. In accordance with the present embodiment, a multi-level stamp 1 is used, wherein each level may have a distinctive structuring 1a, 1b, 1c. At steps A-C a three-leveled surface in a substrate 2a is formed, having regions of different wettability 2b, 2c, 2d pursuant to interaction of the material of the substrate 2 with the stamp 1 at step B.

At step D a gate material 3 may be deposited in the area 2d. The wetting property of the area 2d is selected to be compatible with the material 3.

At step 4 a suitable dielectric material 4 may be deposited on top of the material 3. The dielectric material 4 may act as a material barrier between the material 3 and the material 4 conceived to be deposited in areas 2c.

Finally, at step 5 a semiconductor material 5 may be deposited and at step G the source-drain electrode material 6 may be deposited in areas 2b.

Figure 9:
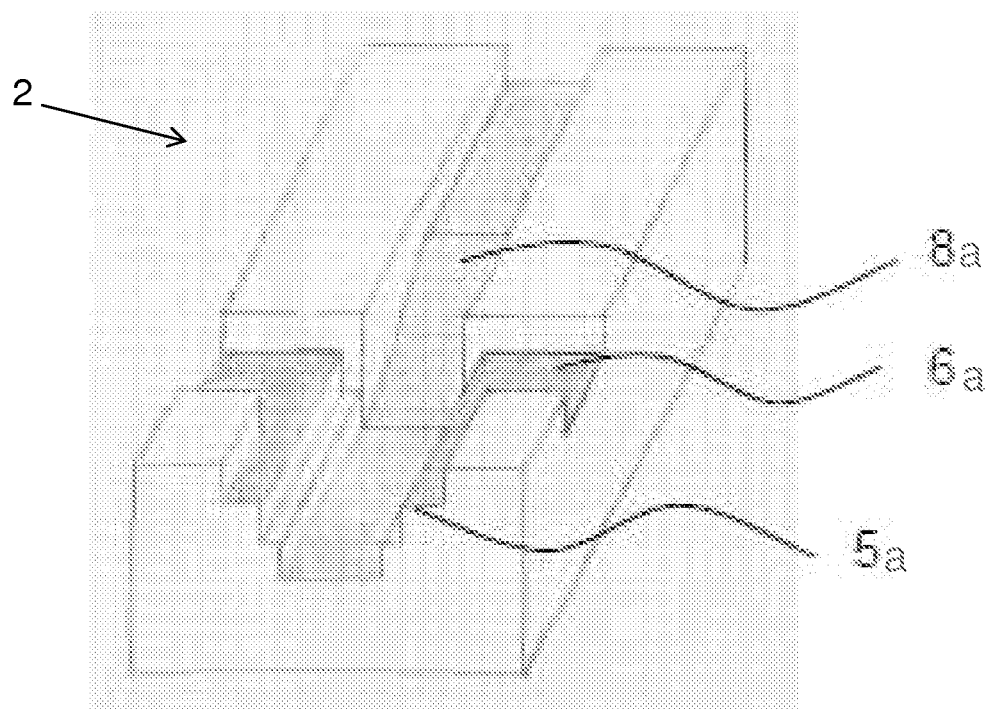
FIG. 9 presents schematically a still further embodiment of the method according to the invention wherein connections between a top and a bottom wiring levels are implemented.

FIG. 9 presents schematically a still further embodiment of the method according to the invention wherein connections between a top and a bottom wiring levels are implemented. For example, a process illustrated with respect to FIG. 2 may be used for creating a two-level surface having different roughness regions. As a result, reference being given to FIG. 2, a first material 3 may be provided which adheres to a first region or regions and a second material 4 which adheres to the second region or regions defined on the substrate 2. It will be appreciated that in order to implement interconnection between the materials 3 and 4 an oblique interface between the top level surface (or surfaces) and the bottom level surface (or surfaces) must be provided. Such oblique interface may be suitably implemented by providing a slope connecting the levels 2a and 2b.

It will be appreciated that the interconnect slope between the two levels may be provided such that the interconnect material is substantially continuous. This may be implemented with the template schematically shown in FIG. 6.

Turning now to FIG. 9, an exemplary embodiment of the implemented interconnect is shown which comprises a complex template including an additional layer of confinement 5a, a slope 8a and an enlargement 6a for the top wiring. Accordingly, the bottom wiring is brought to the surface by the slope 8a. The slope may require an inclination angle preferably less than 20 degrees, more preferably less than 10 degrees, which ensures that no interrupt in the interconnection wiring occurs.

While specific embodiments have been described above, it will be appreciated that the invention may be practiced otherwise than as described. The descriptions above are intended to be illustrative, not limiting. Thus, it will be apparent to one skilled in the art that modifications may be made to the invention as described in the foregoing without departing from the scope of the claims set out below.

The invention claimed is:

1. A method for forming a multi-level surface on a substrate for manufacturing a semiconductor device, said surface comprising areas of different wettability, the method comprising the step of:
applying a multi-level stamp to the substrate for forming the multi-level surface of the semiconductor device, said multi-level stamp having different structural regions arranged along the multi-level surface of the stamp for locally altering wettability properties of at least a portion of a level of the multi-level surface of the substrate.

2. A method according to claim 1, wherein the multi-level stamp comprises different structural regions expanding substantially along each level.

3. A method according to claim 1, wherein the multi-level stamp comprises different structural regions, each partially expanding along at least one mutual level.

4. A method according to claim 1, wherein the structural regions are provided by micro- or nano-machining, by optical lithography, focused ion beam etching, e-beam or laser beam lithography of the multi-level stamp.

5. A method according to claim 1, wherein the substrate is selected from a group consisting of: a flexible polymer/plastic foil, a resist, a gel or rigid substrate with a foil, resist or gel on top.

6. A method according to claim 1, wherein the step of applying the multi-level stamp is selectable from a group consisting of: imprinting, embossing, pressing or imprinting or embossing followed by radiation curing.

7. A method according to claim 1, wherein the multi-level surface comprises a first region having a first wettability and a second region having a second wettability, the method further comprising the steps of:
 a. applying a first material in the first region;
 b. applying a second material in the second region.

8. A method according to claim 1, wherein the stamp comprises two or more levels.

9. A method according to claim 1, wherein local altering of wettability properties of at least a portion of a level of the multi-level surface comprises inducing hydrophobic or hydrophilic properties thereon.

10. A method according to claim 7, wherein the first material and/or the second material are selected from a group consisting of: a metal, a semiconductor, a dielectric.

11. A method according to claim 10, wherein the semiconductor device is a transistor.

12. A method according to claim 7, wherein the first region is connected to the second region by an imprinted interconnect expanding over an inclined area provided between the first region and the second region.

13. A method according to claim 9, wherein the semiconductor device is a transistor.

14. A method according to claim 8, wherein local altering of wettability properties of at least a portion of a level of the multi-level surface comprises inducing hydrophobic or hydrophilic properties thereon.

15. A method according to claim 14, wherein the first material and/or the second material are selected from a group consisting of: a metal, a semiconductor, a dielectric.

16. A method according to claim 2, wherein the structural regions are provided by micro- or nano-machining, by optical lithography, focused ion beam etching, e-beam or laser beam lithography of the multi-level stamp.

17. A method for manufacturing a semiconductor device, the method comprising the step of:
applying a multi-level stamp to a substrate for forming a multi-level surface that comprises areas of different wettability, said multi-level stamp having different structural regions arranged along the multi-level surface of the stamp for locally altering wettability properties of at least a portion of a level of the multi-level surface of the substrate.

18. A method for manufacturing a semiconductor device according to claim 17, wherein the multi-level surface comprises a first region having a first wettability and a second region having a second wettability, the method further comprising the steps of:
  a. applying a first material in the first region; and
  b. applying a second material in the second region.

19. A method for manufacturing a semiconductor device according to claim 18, wherein the first material and/or the second material are selected from a group consisting of: a metal, a semiconductor, and a dielectric.

20. A method for manufacturing a semiconductor device according to claim 17, wherein the semiconductor device is a transistor.

* * * * *